BISTABLE AMPLIFIER CIRCUITS

Filed April 14, 1964 2 Sheets-Sheet 1

INVENTORS
Harry J. Abrams &
Roland W. Roberts
By Hooper, Leonard & Buell
their attorneys May 28, 1968 H. J. ABRAMS ET AL 3,385,973

BISTABLE AMPLIFIER CIRCUITS

Filed April 14, 1964 2 Sheets-Sheet 2

INVENTORS
Harry J. Abrams &
Roland W. Roberts
By Hopgood, Leonard & Buell
their Attorneys United States Patent Office 3,385,973

Patented May 28, 1968

3,385,973

BISTABLE AMPLIFIER CIRCUITS

Harry J. Abrams, Monroeville, and Roland W. Roberts, Pittsburgh, Pa., assignors to Norbatrol Electronics Corporation, a corporation of Pennsylvania Filed Apr. 14, 1964, Ser. No. 359,643
26 Claims. (Cl. 307—38)

Figures 1, 2, 2A, 3, 3A:
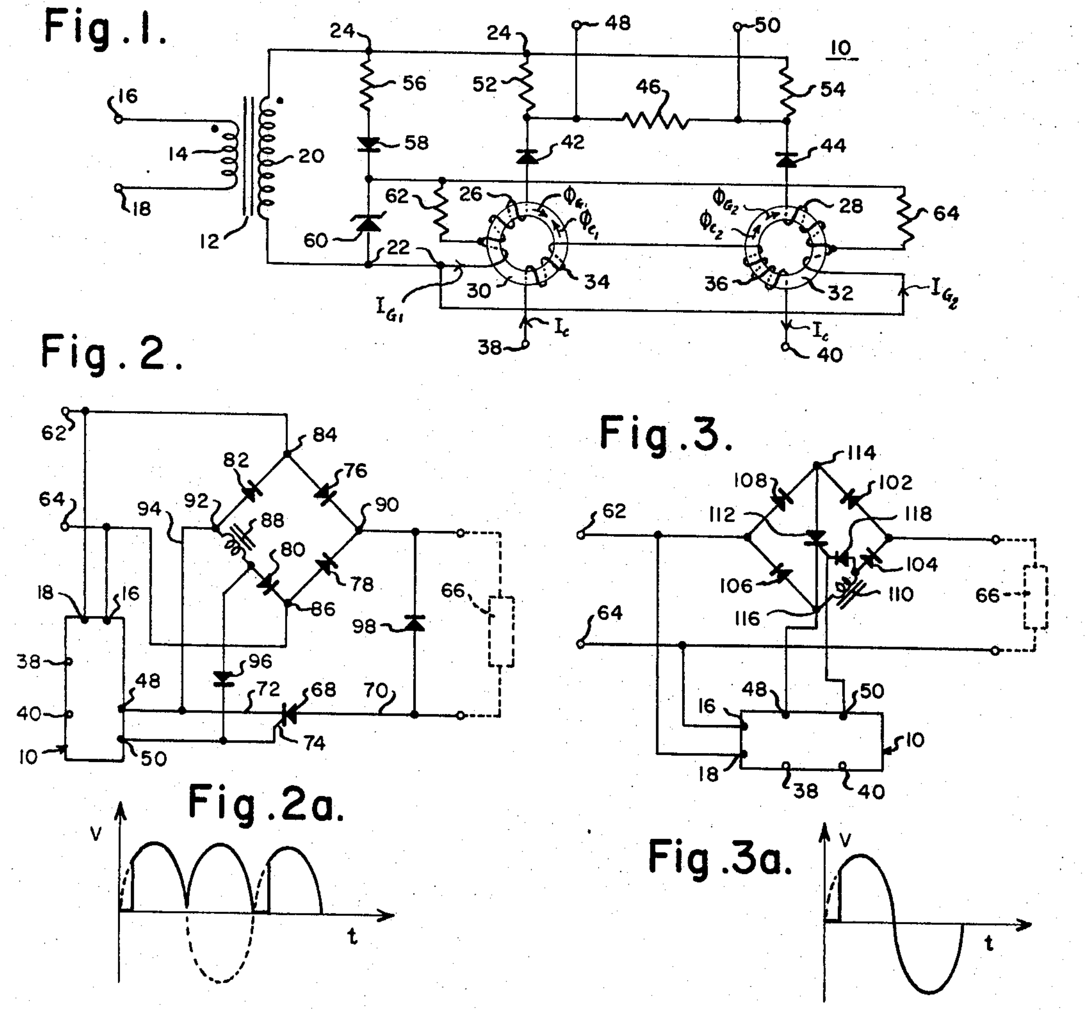

This invention relates to bistable amplifier circuits and particularly to an ultra-sensitive bistable amplifier which may be used as a "static relay" or on-off device in control or indicating systems.

Bistable devices are not new in the electrical industry but have been available for some years. They are generally understood to be a device in which the output changes sharply from a first condition to a second condition at certain input signal levels. These bistable devices have generally combined a magnetic amplifier circuit having a pulse output with a transistor or tube flip-flop circuit.

The deficiencies of this type of bistable amplifier are the use of a number of transistors or tubes, affecting reliability and sensitivity and the limited power handling capability.

The invention herein described overcomes the deficiencies by eliminating much of the circuitry and thereby improving the reliability, sensitivity and power capability.

The invention is a combination of a magnetic amplifier circuit having a pulse type output with a silicon controlled rectifier controlling the flow of current from an AC source to a load. The magnetic amplifier is generally of the half wave "push-pull" type.

Full control is obtained by a minute change in the control power of the magnetic amplifier. Generally, in a magnetic amplifier, it is the average output which is of interest. However, when combined with a silicon controlled rectifier circuit as described in this invention, it is the peak value of the output of the magnetic amplifier which is of importance and not the duration. The output may be in the form of a short pulse of very small power and average content as given by square loop core material magnetic amplifiers. Nevertheless, its existence determines whether or not the silicon controlled rectifier will conduct or not conduct. In general, this means that a small fraction of the power normally required for full control of the magnetic amplifier is sufficient to cause or not to cause conduction of the silicon controlled rectifier.

We provide a bistable amplifier switching power from an AC source to a load depending upon the polarity and magnitude of a control current to the bistable amplifier comprising a power circuit connected between the AC source and the load, the control circuit having a silicon controlled rectifier having an anode, cathode, and gate, the silicon controlled rectifier controlling the flow of current from the AC source to the load, means producing a pulse voltage to the gate of the silicon controlled rectifier which triggers the silicon controlled rectifier depending upon the polarity and magnitude of the control current whereby the power to the load is switched, and means coupling the AC source to the means producing the pulse voltage to the gate of the silicon controlled rectifier.

We preferably provide a half wave self-saturating push-pull magnetic amplifier having the output connected between the gate and the cathode of the silicon controlled rectifier, the magnetic amplifier producing a pulse output voltage which triggers the silicon controlled rectifier depending upon the polarity and magnitude of the control current to the magnetic amplifier, whereby the power to the load is switched.

We provide a dual output bistable amplifier switching power from an AC source to a first output or to a second output depending upon the polarity and magnitude of a control current to the amplifier comprising a power control circuit connected between the AC source and the first and second outputs, the power control circuit having a plurality of silicon controlled rectifiers controlling the flow of current from the AC source to the first and second outputs, a half wave self-saturating push-pull magnetic amplifier having an output coupled to gates of silicon controlled rectifiers, the magnetic amplifier producing a pulse output voltage of a first polarity which triggers a silicon controlled rectifier depending upon the polarity and magnitude of control current to the magnetic amplifier whereby power to the first output is switched, the magnetic amplifier producing a pulse output voltage of a second polarity which triggers a silicon controlled rectifier depending upon the polarity and magnitude of control current to the magnetic amplifier whereby power to the second output is switched, means coupling the magnetic amplifier to the silicon controlled rectifiers so that the reversible polarity of the magnetic amplifier will trigger only one silicon controlled rectifier depending upon the polarity of the pulse voltage from the magnetic amplifier and means coupling the AC source to the magnetic amplifier.

Figures 4, 4A:
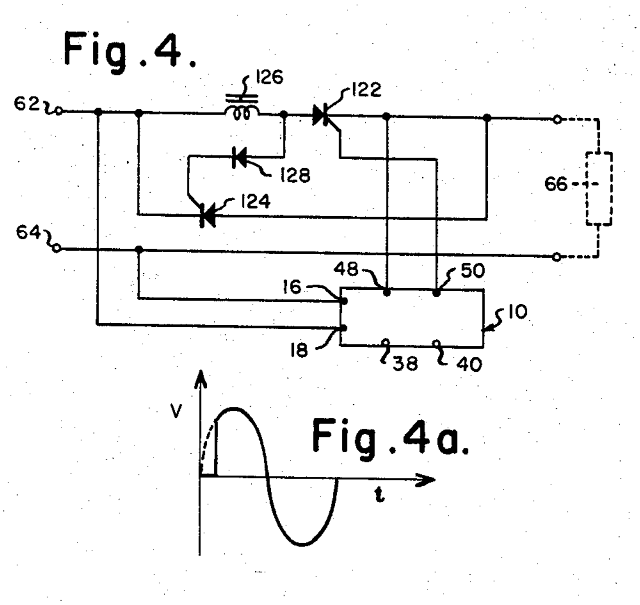
Figure 5:
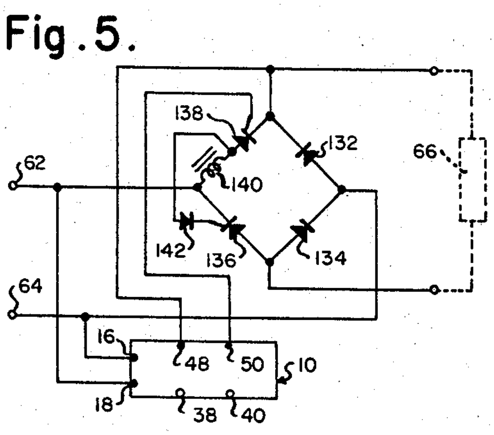
Figure 6:
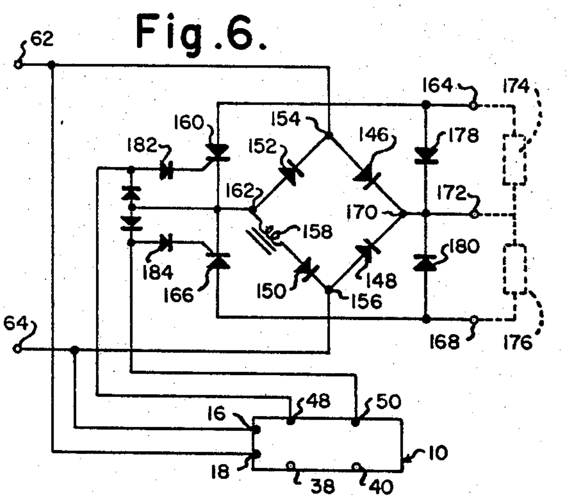
Figure 5A:
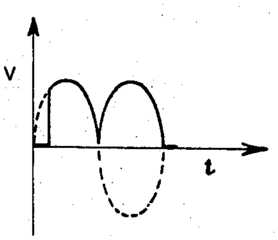
Figure 8:
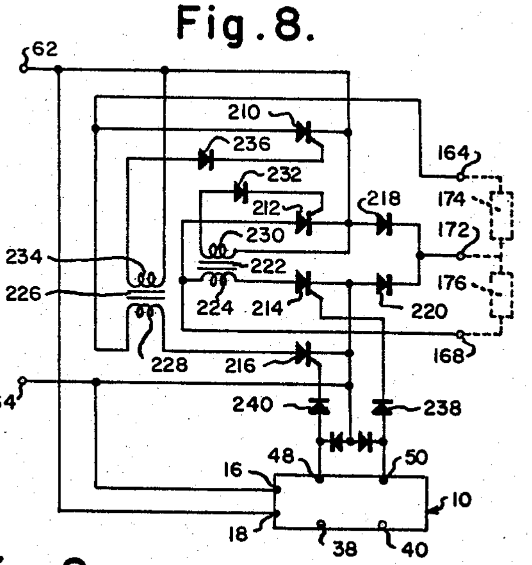
Figure 8A:
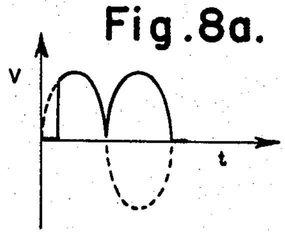

In the foregoing we have set out certain objects, advantages and purposes of this invention. Other objects, advantages and purposes will be apparent from the following description and drawings in which FIGURE 1 is a schematic of a half wave push-pull self-saturating magnetic amplifier;

FIGURE 2 is a schematic circuit diagram of a bistable amplifier providing a controlled DC voltage at a load;

FIGURE 2*a* is a graph of voltage across the load;

FIGURE 3 is a schematic circuit diagram of a bistable amplifier providing a controlled AC voltage at the load;

FIGURE 3*a* is a graph of voltage across the load;

FIGURE 4 is a schematic circuit diagram of a bistable amplifier providing a controlled AC voltage at the load;

FIGURE 4*a* is a graph of voltage across the load;

FIGURE 5 is a schematic circuit diagram of a bistable amplifier providing a controlled DC voltage at the load;

FIGURE 5*a* is a graph across the load;

FIGURE 6 is a schematic circuit diagram of a dual bistable amplifier controlling two outputs;

FGURE 6*a* is a graph of voltage across the load;

FGURE 7 is a schematic circuit diagram of a dual bistable amplifier controlling two outputs;

FGURE 7*a* is a graph of voltage across the load;

FIGURE 8 is a schematic circuit diagram of a dual bistable amplifier controlling two outputs; and FIGURE 8*a* is a graph of voltage across the load.

Referring to FIGURE 1 we have illustrated a push-pull half wave self-saturating magnetic amplifier generally shown as 10 which comprises a transformer core 12 around which primary winding 14 having terminals 16 and 18 is wound. A secondary winding 20 is wound around the core 12 and terminated at junction points 22 and 24. Gate windings 26 and 28 are wound around cores 30 and 32, respectively. Control windings 34 and 36 having terminals 38 and 40 are wound around cores 30 and 32.

The gate windings 26 and 28 are in series with rectifiers 42 and 44, respectively. The output from the magnetic amplifier 10 is taken across resistor load 46 at terminals 48 and 50. Gate resistor loads 52 and 54 are connected to junction point 24. Resistor 56 in series with rectifier 58 which is connected to Zener diode 60 are all connected between junction points 24 and 22.

The bias circuit comprises resistors 62 and 64 tapping gate windings 26 and 28, respectively.

The operation of the magnetic amplifier in the absence of a control current flowing through the control windings 34 and 36 is as follows: an AC source is put across terminals 16 and 18 of the primary winding 14. When terminal 18 is positive, current $I_{G_1}$ and $I_{G_2}$ will flow from junction point 22 through gate windings 26 and 28 to produce a flux $\Phi_{G_1}$ and $\Phi_{G_2}$, respectively. $\Phi_{G_1}$ and $\Phi_{G_2}$ are shown moving in the direction of the arrow on the figure. Assuming ideal conditions in which $\Phi_{G_1}=\Phi_{G_2}$, cores 30 and 32 will fire (that is they will saturate) at the same time and produce a chopped sine wave voltage across resistors 52 and 54. The voltage across resistor 46 is the difference of the two voltages at resistor 52 and 54. In this situation the output voltage between terminals 48 and 50 is zero. Now when the AC source goes negative and terminal 16 is positive with respect to terminal 18, current flows through rectifier 58, resistors 62 and 64 whereby the flux is driven back or reset to the high gain region. On the next half cycle when terminal 18 is again positive the cores are fired again.

Now assume that a control current flows through control windings 34 and 36 so as to make terminal 38 positive with respect to terminal 40. The direction of the control current shown in this situation is shown in FIGURE 1 by $I_C$ which produces a flux $\Phi_{C_1}$ and $\Phi_{C_2}$ in the direction shown on the FIGURE 1.

The control winding 34 and the control current through it are such that $\Phi_{C_1}$ tends to oppose $\Phi_{G_1}$. The flux produced by the control current tends to oppose the flux produced by the gate current. The control winding 36 and the control current through it are such that $\Phi_{C_2}$ tends to add to $\Phi_{G_2}$. Therefore, whenever terminal 18 is positive with respect to terminal 16 and terminal 38 is positive with respect to terminal 40, core 32 will saturate prior to core 30 because of the relationship of the fluxes in the respective cores. The opposing fluxes in core 30 cause it to take a longer time to saturate. The adding fluxes in core 32 cause it to take less time to saturate. Therefore, between the time core 32 saturates until just before core 30 subsequently saturates, there is a voltage difference present across resistor 46 in which terminal 50 is positive with respect to terminal 48. This voltage is in the form of a pulse. Throughout the specification the term first polarity refers to the time when terminal 50 is positive with respect to terminal 48. In order to make terminal 48 positive with respect to terminal 50 (which is referred to as a second polarity) all that need be done is to reverse the polarity of $I_C$ and make terminal 40 positive with respect to terminal 38. This produces the opposite result in the cores by changing the direction of the flux produced by the control current $I_C$. In this situation core 30 saturates prior to core 32 and terminal 48 has a positive pulse voltage with respect to terminal 50.

Referring to FIGURE 2 a rectifier circuit couples an AC source at terminals 62 and 64 with a load 66. The rectifier circuit is controlled by a silicon controlled rectifier 68, hereinafter referred to as SCR. The SCR has an anode 70, a cathode 72, and a gate 74. The gate 74 and cathode 72 are connected directly to the output terminals 50 and 48 of the magnetic amplifier 10. A full wave rectification bridge circuit comprising rectifiers 76, 78, 80, and 82 are connected to the AC source at terminals 84 and 86. Rectifier 80 has an inductor 88 in series with it. The DC terminal 90 of the bridge circuit is connected directly to the load 66. The other DC terminal 92 of the bridge circuit is connected to the load 66 through SCR 68. The means coupling the inductor 88 to the gate 74 and cathode 72 of SCR 68 comprises lead 94 and rectifier 96. Rectifier 98 is used whenever inductive loads are applied at load 66.

The circuit described above operates as follows: Assume an output pulse from the magnetic amplifier 10 in which terminal 50 is positive with respect to terminal 48. This pulse triggers SCR 68. It must be remembered throughout the specification during the discussion of the SCR's that in order to trigger the SCR a positive voltage only must be applied at the gate. A negative voltage at the gate of the SCR will not fire or trigger it. Triggering or firing refers to the time when the anode conducts current to the cathode as though a switch were thrown between the anode and the cathode. Until the SCR is triggered, it appears as an open switch and the only way to close the switch is to apply a positive voltage at the gate.

When AC terminal 62 is positive with respect to terminal 64 and at the same time assume terminal 50 produces a positive voltage with respect to terminal 48, the SCR is triggered. Current will flow from the AC terminal 62 to terminal 84, through rectifier 76, to terminal 90, through load 66, through SCR 68, to terminal 92, through inductor 88, through rectifier 80, to the AC terminal 86 of full wave rectifier bridge circuit, and return to the AC source terminal 64. In order to keep an SCR conducting after it has once been triggered, the anode current cannot be permitted to fall to zero. If the anode current falls to zero, then the SCR must be retriggered, even though the anode voltage subsequently goes positive. After the first half cycle in the particular circuit described is ended, the current must go to zero. In order to retrigger the SCR 68 in the absence of a voltage pulse from the magnetic amplifier 10, an inductor 88 is used. When the current approaches zero across the load 66 and in the anode 70 of the SCR 68, the flux in inductor 88 collapses and produces a current through rectifier 96 thereby applying positive voltage on the gate 74 and retriggering the SCR 68. At that moment terminal 64 turns positive with respect to terminal 62 in the AC source and sufficient current flows through the anode 70 from the full wave rectifier bridge circuit during the remainder of the second half cycle until the current again approaches zero when terminal 62 begins to turn positive with respect to terminal 64. When terminal 64 is positive with respect to terminal 62, the current flows to the AC terminal 86 of the bridge circuit, through rectifier 78, to the DC terminal 90 of the bridge circuit, through the load 66, through the SCR 68, through lead 94, to the AC terminal 92 at the bridge circuit, through rectifier 82, to terminal 84 of the bridge circuit, returning to AC source terminal 62. The voltage across the load 66 appears as shown in graph of FIGURE 2*a*. The dotted lines on the graph represent the voltage between the AC terminals 64 and 62. A solid line represents the actual voltage as seen across load 66. The magnetic amplifier has its power supplied from the same AC source through a pair of leads so that when terminal 62 is positive the AC voltage on the terminal 18 of the magnetic amplifier is positive.

We have shown a bistable amplifier that switches power from an AC source to a load 66 depending upon the polarity and magnitude of the control current at terminals 40 and 38 of the magnetic amplifier 10. The AC power was switched in such a manner as to produce a full cycle of controlled DC voltage at the load 66 as shown in the graph.

Referring to FIGURE 3 a bridge circuit comprising rectifiers 102, 104, 106 and 108 couples the AC source from the terminal 62 to the load 66. An inductor 110 is in series with rectifier 104. SCR 112 shorts the DC terminals 114 and 116 of the bridge circuit. The magnetic amplifier 10 is coupled to the cathode and the gate of the SCR 112. The inductor 110 couples the gate of the SCR 112 by rectifier 118.

Assuming a positive voltage at terminal 50 with respect to terminal 48 of the magnetic amplifier 10 and at the same time a positive AC source on terminal 62, the SCR will trigger and current will flow from terminal 62 through rectifier 108, through SCR 112, through inductor 110, through rectifier 104, through load 66, and return to terminal 64. When terminal 64 goes positive with respect to terminal 62 at the AC source, the flux in the inductor 110 collapses and the voltage triggers SCR 112 through rectifier 118. Current flows from terminal 64 of the AC source to the load 66, through rectifier 102, through SCR 112, through rectifier 106, and returns to terminal 62 of the AC source.

FIGURE 3a is a graph showing the voltage in heavy solid lines across the load 66. The dotted line shows the voltage across the AC terminals 62 and 64.

Referring to FIGURE 4 an AC source at terminals 62 and 64 is coupled to a load 66 by a coupling circuit comprising SCR 122, SCR 124, an inductor 126 in series with SCR 122, the inductor 126 coupled to the gate of SCR 124 through rectifier 128. The magnetic amplifier 10 is coupled to the gate and cathode of SCR 122.

Assuming a positive voltage on terminal 50 of the magnetic amplifier 10 which fires SCR 122 and at the same time a positive voltage on terminal 62 with respect to terminal 64 on the AC source, current flows from terminal 62 through inductor 126, through SCR 122, through load 166 and returns to terminal 64 of the AC source. When terminal 64 goes positive with respect to terminal 62, the current from inductor 126 triggers SCR 124 through rectifier 128, and current flows from terminal 64 of the AC source, through load 66, through SCR 124, and returns to terminal 62.

FIGURE 4a is a graph showing the voltage across the load 66 in solid lines and the voltage across the AC terminals with a dotted line.

Referring to FIGURE 5 a full wave rectification bridge circuit comprising rectifiers 132, 134, SCR 136 and SCR 138, couples terminal 62 to the load 66. Terminals 48 and 50 of the magnetic amplifier 10 are coupled to SCR 138 at the gate and cathode. Inductor 140 is in series with SCR 138 and is coupled to SCR 136 through rectifier 142.

When terminal 50 is positive with respect to terminal 48 on the magnetic amplifier 10 and terminal 62 is positive with respect to terminal 64 of the AC source, SCR 138 is triggered and current flows through inductor 140, through SCR 138, through load 66, through rectifier 134 and returns to terminal 64. When terminal 64 is positive with respect to terminal 62, the flux in inductor 140 collapses and applies a positive voltage through rectifier 142 to the gate of SCR 136 triggering it and current flows from terminal 64, through rectifier 132, through load 66, through SCR 136, which has just been triggered, and returns to terminal 62 of the AC source.

FIGURE 5a shows the DC voltage across the load 66 in solid lines and the voltage across the AC terminals 62 and 64 in dotted lines.

Referring to FIGURE 6 a full wave rectification bridge circuit, comprising rectifiers 146, 148, 150, and 152, is coupled at terminals 154 and 156 to the AC terminals 62 and 64, respectively. Inductor 158 is in series with rectifier 150. SCR 160 couples the DC terminal 162 of the bridge circuit to output terminal 164. SCR 166 couples DC terminal 162 of the bridge circuit to output terminal 168. DC terminal 170 of the bridge circuit provides output terminal 172. Loads 174 and 176 are normally connected across the output terminals 164, 172, and 168 and rectifiers 178 and 180 are used in conjunction with inductive loads. Magnetic amplifier 10 is coupled from terminals 48 and 50 to the gates of SCR's 160 and 166 through rectifiers 182 and 184. Assuming that terminal 50 on magnetic amplifier 10 is positive at the same time terminal 62 is positive on the AC source, the magnetic amplifier will therefore trigger SCR 166. Current will flow from output terminal 172, through load 176, to output terminal 168, then through the triggered SCR 166, through inductor 158, through rectifier 150, to AC terminal 156 of the bridge circuit to AC source terminal 64. In order to keep current in the anode of SCR 166 to insure its conduction whenever the AC source goes to zero, inductor 158 is used. When the current is zero, the flux in inductor 158 collapses causing current to flow through rectifier 150, through rectifier 148, through the load 176, and through the SCR 166, whereby the current passing through load 176 and SCR 166 never reaches zero.

When terminal 64 goes positive with respect to AC terminal 62, current flows to AC terminal 156 of the bridge circuit to the rectifier 148, to output terminal 172, through load 176 to output terminal 168, through SCR 166, through the DC terminal 162 of the bridge circuit, through rectifier 152, to the AC terminal 154 of the bridge circuit to AC terminal 62.

Now assuming a change of polarity and magnitude of control current to terminals 38 and 40 of the magnetic amplifier 10 which causes terminal 48 to go positive with respect to terminal 50. A positive voltage will be applied to the gate of the SCR 160 which will trigger the SCR 160. The SCR 166 will not be triggered because the voltage is negative with respect to its gate. On the first half cycle, that is when terminal 62 of the AC source is positive with respect to terminal 64, current flows from terminal 62, through rectifier 146, to output terminal 172, through load 174, to output terminal 164, through the triggered SCR 160, to the DC terminal 162 of the bridge circuit, through inductor 158, through rectifier 150, returning to AC terminal 64. The inductor 158 prevents the current at the load 174 from approaching zero whenever AC terminal 64 goes positive with respect to AC terminal 162 and thereby keeps the SCR 160 conducting for a full cycle of AC power at terminals 62 and 64.

Figure 6A:
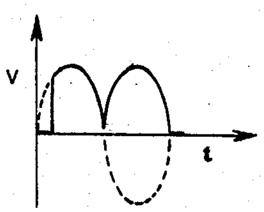

FIGURE 6a is a graph showing the output voltage across terminals 172 and 164 or 172 and 168. As we have shown depending upon the polarity and magnitude of the control current to terminals 38 and 40 of the magnetic amplifier 10, we will have an output voltage produced across output terminals 164 and 172 or output terminals 172 and 168.

Figure 7:
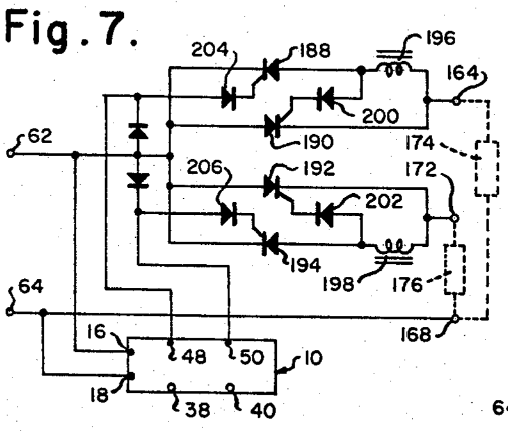

Referring to FIGURE 7, a coupling circuit couples AC terminals 62 and 64 with output terminals 164, 172, and 168. The coupling circuit comprises SCR's 188, 190, 192, 194, inductors 196 and 198 are in series with SCR's 188 and 194, respectively. Inductors 196 and 198 are coupled to SCR's 190 and 192 through rectifiers 200 and 202, respectively. Magnetic amplifier 10 is coupled to the gates of SCR's 188 and 194 through rectifiers 204 and 206, respectively.

Assuming magnetic amplifier 10 produces an output pulse voltage in which terminal 50 is positive with respect to terminal 48 and at the same time terminal 64 is positive with respect to terminal 62, SCR 194 will be triggered and current will flow from terminal 64 to output terminal 168, through load 176, to output terminal 172, through inductor 198, through SCR 194, returning to AC terminal 62. As the AC voltage supply between terminals 62 and 64 approaches zero, the flux from inductor 198 collapses and produces a current through rectifier 202, to the gate of the SCR 192, triggering the SCR 192, and at the same time terminal 62 goes positive with respect to terminal 64 causing the current to flow through SCR 192, which has recently been triggered, to output terminal 172, through load 176, to output terminal 168, returning to AC terminal 64.

Assuming terminal 48 of magnetic amplifier 10 is positive with respect to terminal 50, SCR 188 will be triggered and current will flow from terminal 64, through load 174, to output terminal 164, through inductor 196, through the triggered SCR 188, to AC terminal 62.

When terminal 62 goes positive with respect to terminal 64, the inductor 196 triggers SCR 190 and current flows through SCR 190, to output terminal 164, through load 172, and returns to AC terminal 64.

Figure 7A:
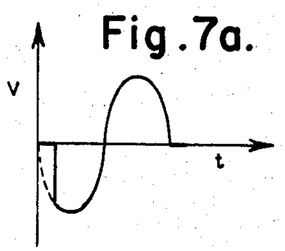

FIGURE 7a is a graph showing the output voltage across load 174 or load 176.

Referring to FIGURE 8, a full wave rectifier circuit couples AC terminals 62 and 64 to output terminals 164, 172, and 168. The full wave rectifier circuit comprises SCR's 210, 212, 214, 216, rectifiers 218 and 220. Transformer 222 has a primary winding 224 in series with SCR 214. Transformer 226 has primary winding 228 in series with SCR 216. The secondary winding 230 of transformer 222 is coupled through rectifier 232 to the gate of SCR 212. Secondary winding 234 of transformer 226 is coupled to the gate of SCR 210 through rectifier 236.

Rectifiers 238 and 240 couple the magnetic amplifier 10 to the gates of SCR's 214 and 216, respectively.

Assuming a pulse output voltage from magnetic amplifier 10 in which terminal 50 is positive with respect to terminal 48, SCR 214 will be triggered and current will flow from AC terminal 62 which is positive with respect to terminal 64, through rectifier 218, to output terminal 172, through load 176, to output terminal 168, through the primary winding of transformer 224, through recently triggered SCR 214, returning to terminal 64. As AC source terminal 64 goes positive with respect to AC source terminal 62, the flux in the primary winding 224 collapses and produces an output voltage which is coupled through rectifier 232 and triggers SCR 212. At the time current flows from terminal 64, through rectifier 220, through terminal 172, through load 176, to output terminal 168, through SCR 212, returning to AC terminal 62.

Assuming a change in polarity and magnitude of the control current at terminals 38 and 40 of the magnetic amplifier which produces a positive pulse voltage at terminal 48 with respect to terminal 50, SCR 216 will be triggered and current will flow from positive AC terminal 62, through rectifier 218, to output terminal 172, through load 174, through primary winding 228, through SCR 216, returning to terminal 64. When terminal 64 is positive with respect to terminal 62, transformer 226 will trigger SCR 210 and current will flow from terminal 64, through rectifier 220, through load 174, to output terminal 164, through the recently triggered SCR 210, returning to output terminal 62.

FIGURE 8*a* is a graph showing the output voltage across load 174 or 176.

While we have illustrated and described a present preferred embodiment of our invention in the foregoing specification, it will be understood that this invention may be otherwise variously embodied within the scope of the following claims.

We claim:

1. A bistable amplifier switching power from an AC source to a load depending upon the polarity and magnitude of a control current to the bistable amplifier comprising:

(a) a rectifier circuit connected to the AC source to produce a DC output at the load, the rectifier circuit having an inductor through which the current flows during the first half cycle of AC power;

(b) a silicon controlled rectifier having an anode, cathode, and gate, the silicon controlled rectifier coupling the load with the rectifier circuit, the silicon controlled rectifier controlling the flow of current from the rectifier circuit to the load;

(c) a half wave self-saturating push-pull magnetic amplifier having the output connected between the gate and the cathode of the silicon controlled rectifier, the magnetic amplifier producing a pulse output voltage which triggers the silicon controlled rectifier during the first half cycle of AC power depending upon the polarity and magnitude of the control current to the magnetic amplifier whereby the power to the load is switched;

(d) means coupling the inductor to the gate of the silicon controlled rectifier whereby the silicon controlled rectifier is triggered at the beginning of the second half cycle of AC power when the silicon controlled rectifier has previously been fired on the first half cycle whereby the second half cycle of power is coupled to the load; and (e) means coupling the AC source to the magnetic amplifier.

2. A bistable amplifier switching power from an AC source to a load depending upon the polarity and magnitude of a control current to the bistable amplifier as recited in claim 1 wherein the rectifier circuit comprises a full wave rectification bridge with the inductor in one leg, the AC source connected to the AC terminals of the bridge circuit.

3. A bistable amplifier switching power from an AC source to a load depending upon the polarity and magnitude of a control current to the bistable amplifier comprising:

(a) a full wave rectifier circuit having one AC terminal connected to the AC source, the other AC terminal connected to the load;

(b) a silicon controlled rectifier connected between the DC terminals of the full wave rectifier circuit thereby shorting the DC terminals of the full wave rectifier circuit, the silicon controlled rectifier controlling the flow of current from the rectifier to the load, whereby a controlled AC voltage is produced at the load;

(c) an inductor connected in the full wave rectifier circuit through which the current flows during the first half cycle of AC power;

(d) a half wave self-saturating push-pull magnetic amplifier having the output connected between the gate and cathode of the silicon controlled rectifier, the magnetic amplifier producing a pulse output voltage which triggers the silicon controlled rectifier during the first half cycle of AC power depending upon the polarity and magnitude of the control current to the magnetic amplifier whereby the power to the load is switched;

(e) means coupling the inductor to the gate of the silicon controlled rectifier whereby the silicon controlled rectifier is triggered at the beginning of the second half cycle of AC power when the silicon controlled rectifier has previously been fired on the first half cycle; and (f) means coupling the AC source of power to the magnetic amplifier.

4. A bistable amplifier switching power from an AC source to a load depending upon the polarity and magnitude of a control current to the bistable amplifier as recited in claim 3 wherein the full wave rectifier circuit comprises a full wave rectifier bridge circuit having the inductor in one leg of the bridge circuit and the silicon controlled rectifier connected between the DC terminals whereby when the silicon controlled rectifier conducts, a full cycle of AC current from the AC source flows through the silicon controlled rectifier to produce a controlled AC voltage to the load.

5. A bistable amplifier switching power from an AC source to a load depending upon the polarity and magnitude of a control current to the bistable amplifier comprising:

(a) a circuit coupling the AC source with the load having:

(1) a plurality of silicon controlled rectifiers having anodes, cathodes, and gates, controlling the flow of current from the AC source to the load whereby a controlled AC voltage is produced at the load;

(2) an inductor in series with one silicon controlled rectifier connected so that the current flows through the inductor during the first half cycle of AC power to the load;

(b) a half wave self-saturating push-pull magnetic amplifier having the output connected between the gate and the cathode of one silicon controlled rectifier, the magnetic amplifier producing a pulse output voltage which triggers a silicon controlled rectifier during the first half cycle of AC power depending upon the polarity and magnitude of the control current to the magnetic amplifier whereby the power to the load is switched;

(c) means coupling the inductor to the gate of a silicon controlled rectifier whereby the silicon controlled rectifier triggers at the beginning of the second half cycle of AC power when the silicon controlled rectifier in series with the inductor has previously been triggered on the first half cycle of power; and (d) means coupling the AC to the magnetic amplifier.

6. A bistable amplifier switching power from an AC source to a load depending upon the polarity and magnitude of a control current to the bistable amplifier comprising:

(a) a circuit coupling the AC sources with the load having:

(1) a first silicon controlled rectifier having an anode, cathode, and gate controlling the flow of current from the source to the load during the first half cycle of AC power;

(2) a second silicon controlled rectifier having an anode, cathode, and gate controlling the flow of current from the source to the load during the second half cycle of AC power whereby a controlled AC voltage is produced at the load;

(3) an inductor in series with the first silicon controlled rectifier whereby current flows through the inductor during the first half cycle of AC power to the load;

(b) a half wave self-saturating push-pull magnetic amplifier having the output connected between the gate and the cathode of the first silicon controlled rectifier, the magnetic amplifier producing a pulse output voltage which triggers the first silicon controlled rectifier during the first half cycle of AC power depending upon the polarity and magnitude of the control current to the magnetic amplifier whereby the power to the load is switched;

(c) means coupling the inductor to the gate of the second silicon controlled rectifier whereby the second silicon controlled rectifier triggers at the beginning of the second half cycle of AC power when the first silicon controlled rectifier has previously been triggered on the first half cycle of AC power; and (d) means coupling the AC source to the magnetic amplifier.

7. A bistable amplifier switching power from an AC source to a load depending upon the polarity and magnitude of a control current to the bistable amplifier comprising:

(a) a full wave rectifier circuit coupling the AC source to produce a DC output at the load, the rectifier circuit having:

(1) a plurality of silicon controlled rectifiers having anodes, cathodes, and gates controlling the flow of current from the AC source to the load whereby a controlled DC voltage is produced at the load;

(2) an inductor in series with one silicon controlled rectifier connected so that the current flows through the inductor during the first half cycle of AC power to the load;

(b) a half wave self-saturating push-pull magnetic amplifier having the output connected between the gate and the cathode of one silicon controlled rectifier, the magnetic amplifier producing a pulse output voltage which triggers a silicon controlled rectifier during the first half cycle of AC power depending upon the polarity and magnitude of the control current to the magnetic amplifier whereby the power to the load is switched;

(c) means coupling the inductor to the gate of a silicon controlled rectifier whereby the silicon controlled rectifier triggers at the beginning of the second half cycle of AC power when the silicon controlled rectifier in series with the inductor has previously been fired on the first half cycle of power; and (d) means coupling the AC to the magnetic amplifier.

8. A bistable amplifier switching power from an AC source to a load depending upon the polarity and magnitude of a control current to the bistable amplifier comprising:

(a) a full wave rectification bridge circuit having its DC terminals connected to the load and the AC terminals connected to the AC source, the full wave rectification bridge having:

(1) a first silicon controlled rectifier in one leg of the bridge circuit, the silicon controlled rectifier having an anode, cathode, and gate controlling the flow of current from the AC source to the load during the first half cycle of AC power;

(2) a second silicon controlled rectifier in another leg of the bridge circuit, the silicon controlled rectifier having an anode, cathode, and gate controlling the flow of current from the AC source to the load during the second half cycle of AC power whereby a controlled DC voltage is produced at the load;

(3) an inductor in series with the first silicon controlled rectifier whereby current flows through the inductor during the first half cycle of AC power to the load;

(b) a half wave self-saturating push-pull magnetic amplifier having the output connected between the gate and the cathode of the first silicon controlled rectifier, the magnetic amplifier producing a pulse output voltage which triggers the first silicon controlled rectifier during the first half cycle of AC power depending upon the polarity and magnitude of the control current to the magnetic amplifier whereby the power to the load is switched;

(c) means coupling the inductor to the gate of the second silicon controlled rectifier whereby the second silicon controlled rectifier triggers at the beginning of the second half cycle of AC power when the first silicon controlled rectifier has previously been triggered on the first half cycle of AC power; and (d) means coupling the AC source to the magnetic amplifier.

9. A dual output bistable amplifier switching power from an AC source to a first output or to a second output depending upon the polarity and magnitude of a control current to the amplifier comprising:

(a) a power control circuit connected between the AC source and the first and second outputs, the power control circuit having a plurality of silicon controlled rectifiers having cathodes, anodes, and gates, the silicon controlled rectifiers controlling the flow of current from the AC source to the first and second outputs;

(b) a half wave self-saturating push-pull magnetic amplifier having an output coupled to gates of silicon controlled rectifiers, the magnetic amplifier producing a pulse output voltage of a first polarity which triggers a silicon controlled rectifier depending upon the polarity and magnitude of control current to the magnetic amplifier whereby power to the first output is switched, the magnetic amplifier producing a pulse output voltage of a second polarity which triggers a silicon controlled rectifier depending upon the polarity and magnitude of control current to the magnetic amplifier whereby power to the second output is switched;

(c) means coupling the output of the magnetic amplifiers to the silicon controlled rectifiers; and (d) means coupling the AC source to the magnetic amplifier.

10. A dual output bistable amplifier switching power from an AC source to a first output or to a second output depending upon the polarity and magnitude of a control current to the amplifier comprising:

(a) a rectifier circuit connected to the AC source to produce a DC voltage at both outputs, the rectifier circuit having an inductor through which current flows during the first half cycle of AC power;

(b) a first silicon controlled rectifier having an anode, cathode, and gate coupling the first output to the rectifier circuit and controlling the flow of current from the rectifier circuit to the first output;

(c) a second silicon controlled rectifier having an anode, cathode, and gate coupling the second output to the rectifier circuit and controlling the flow of current from the rectifier circuit to the second output;

(d) a half wave self-saturating push-pull magnetic amplifier having an output voltage fed to the gates of the first and second silicon controlled rectifiers, the magnetic amplifier producing a pulse output voltage of a first polarity which triggers the first silicon controlled rectifier depending upon the polarity and magnitude of control current to the magnetic amplifier whereby power from the AC source is switched to the first output, the magnetic amplifier producing a pulse output voltage of a second polarity which triggers the second silicon controlled rectifier depending upon the polarity and magnitude of the control current to the magnetic amplifier whereby power from the AC source is switched to the second output;

(e) means coupling the magnetic amplifier to the silicon controlled rectifiers so that the reversible polarity of the magnetic amplifier will trigger only one silicon controlled rectifier depending upon the polarity of the pulse from the magnetic amplifier; and (f) means coupling the AC source to the magnetic amplifier.

11. A dual output bistable amplifier switching power from an AC source to a first or to a second output depending upon the polarity and magnitude of a control current to the amplifier as recited in claim 10 wherein the rectifier circuit comprises a full wave rectification bridge circuit with the AC source connected to the AC terminals of the bridge circuit and both silicon controlled rectifiers connected to one DC terminal of the bridge circuit, the other DC terminal common to both outputs.

12. A dual output bistable amplifier switching power from an AC source to a first output or to a second output depending upon the polarity and magnitude of a control current to the amplifier comprising:

(a) a circuit coupling the AC source with the first and second outputs having:

(1) a plurality of silicon controlled rectifiers having anodes, cathodes, and gates controlling the flow of current from the AC source to the first and second outputs whereby a controlled AC voltage is produced at each output;

(2) a plurality of inductors, each inductor in series with a silicon controlled rectifier so that the current flows through the inductor during the first half cycle of AC power to the outputs when the silicon controlled rectifier in series is conducting;

(b) a half wave self-saturating push-pull magnetic amplifier having an output coupled to the gates of the silicon controlled rectifiers, the magnetic amplifier producing a pulse output voltage of a first polarity which triggers a silicon controlled rectifier depending upon the polarity and magnitude of control current to the magnetic amplifier whereby power to the first output is switched, the magnetic amplifier producing a pulse output voltage of a second polarity which triggers a silicon controlled rectifier depending upon the polarity and magnitude of control current to the magnetic amplifier whereby power to the second output is switched;

(c) means coupling each inductor to the gate of a silicon controlled rectifier whereby the silicon controlled rectifier triggers at the beginning of the second half cycle of AC power when the silicon controlled rectifier in series with the inductor has previously been triggered on the first half cycle of power;

(d) means coupling the magnetic amplifier to the silicon controlled rectifiers so that the reversible polarity of the magnetic amplifier will trigger only one silicon controlled rectifier depending upon the polarity of the pulse from the magnetic amplifier; and (e) means coupling the AC source to the magnetic amplifier.

13. A dual output bistable amplifier switching power from an AC source to a first output or to a second output depending upon the polarity and magnitude of a control current to the amplifier comprising:

(a) a circuit coupling the AC source with the first and second outputs having:

(1) a first silicon controlled rectifier having an anode, cathode, and gate controlling the flow of current from the AC source to the first output during the first half cycle of AC power;

(2) a second silicon controlled rectifier having an anode, cathode, and gate controlling the flow of current from the AC source to the first output during the second half cycle of AC power whereby a controlled AC voltage is produced at the first output;

(3) a third silicon controlled rectifier having an anode, cathode, and gate controlling the flow of current from the AC source to the second output during the first half cycle of AC power;

(4) a fourth silicon controlled rectifier having an anode, cathode, and gate controlling the flow of current from the AC source to the second output during the second half cycle of AC power whereby a controlled AC voltage is produced at the second output;

(b) a first inductor in series with the first silicon controller rectifier;

(c) a second inductor in series with the third silicon controlled rectifier;

(d) a half wave self-saturating push-pull magnetic amplifier having an output fed to the gates of the first and third silicon controlled rectifiers, the magnetic amplifier producing a pulse output voltage of a first polarity which triggers the first silicon controlled rectifier depending upon the polarity and magnitude of control current to the magnetic amplifier whereby the AC power is switched to the first output, the magnetic amplifier producing a pulse output voltage of a second polarity which triggers the third silicon controlled rectifier depending upon the polarity and magnitude of control current to the magnetic amplifier whereby the AC power is switched to the second output;

(e) means coupling the first inductor to the second silicon controlled rectifier whereby the second silicon controlled rectifier triggers at the beginning of the second half cycle of AC power when the first silicon controlled rectifier has previously been triggered on the first half cycle of AC power;

(f) means coupling the second inductor to the fourth silicon controlled rectifier whereby the fourth silicon controlled rectifier triggers at the beginning of the second half cycle of AC power when the third silicon controlled rectifier has previously been triggered on the first half cycle of AC power;

(g) means coupling the magnetic amplifier output voltage to the first and third silicon controlled rectifiers so that the reversible polarity of the magnetic amplifier will trigger only one silicon controlled rectifier depending upon the polarity of the pulse from the magnetic amplifier; and (h) means coupling the AC source to the magnetic amplifier.

14. A dual output bistable amplifier switching power from an AC source to a first output or to a second output depending upon the polarity and magnitude of a control current to the amplifier comprising:

(a) a full wave rectifier circuit coupling the AC source to the first and second outputs to produce a DC output voltage across each output, the full wave rectifier circuit having:

(1) a plurality of silicon controlled rectifiers having anodes, cathodes, and gates, controlling the flow of current from the AC source to the first and second outputs;

(2) a plurality of inductors, each inductor in series with a silicon controller rectifier and connected so that current flows through the indicator during the first half cycle of AC power to the first or second outputs when the silicon controlled rectifier in series with the inductor is conducting;

(b) a half wave self-saturating push-pull magnetic amplifier having an output coupled to gates of silicon controlled rectifiers, the magnetic amplifier producing a pulse output voltage of a first polarity which triggers a silicon controlled rectifier depending upon the polarity and magnitude of control current to the magnetic amplifier whereby power to the first output is switched, the magnetic amplifier producing a pulse output voltage of a second polarity which triggers a silicon controlled rectifier depending upon the polarity and magnitude of control current to the magnetic amplifier whereby power to the second output is switched;

(c) means coupling each inductor to a gate of a silicon controlled rectifier whereby the silicon controlled rectifier triggers at the beginning of the second half cycle of AC power when the silicon controlled rectifier in series with the inductors has previously been triggered on the first half cycle;

(d) means coupling the output of the magnetic amplifier to silicon controlled rectifiers so that the reversible polarity of the magnetic amplifier will trigger only one silicon controlled rectifier depending upon the polarity of the pulse from the magnetic amplifier; and (e) means coupling the AC source to the magnetic amplifier.

15. A dual output bistable amplifier switching power from an AC source to a first output or to a second output depending upon the polarity and magnitude of a control current to the amplifier comprising:

(a) a full wave rectifier circuit coupling the AC source to the first and second outputs to produce a DC output voltage across each output, the full wave rectifier circuit having:

(1) a first silicon controlled rectifier having an anode, cathode, and gate controlling the flow of current from the AC source to the first output during the first half cycle of AC power;

(2) a second silicon controlled rectifier having an anode, cathode, and gate controlling the flow of current from the AC source to the first output during the second half cycle of AC power;

(3) a third silicon controlled rectifier having an anode, cathode, and gate controlling the flow of current from the AC source to the second output during the first half cycle of AC power;

(4) a fourth silicon controlled rectifier having an anode, cathode, and gate controlling the flow of current from the AC source to the second output during the second half cycle of AC power;

(5) a first inductor in series with the first silicon controlled rectifier;

(6) a second inductor in series with the third silicon controlled rectifier;

(b) a half wave self-saturating push-pull magnetic amplifier having an output to the gates of the first and third silicon controlled rectifiers, the magnetic amplifier producing a pulse output voltage of a first polarity which triggers the first silicon controlled rectifier depending upon the polarity and magnitude of control current to the magnetic amplifier whereby power is switched to the first output, the magnetic amplifier producing a pulse output voltage of a second polarity which triggers the third silicon controlled rectifier depending upon the polarity and magntiude of control current to the magnetic amplifier whereby power is switched to the second output;

(c) means coupling the first inductor to the gate of the second silicon controlled rectifier whereby the second silicon controlled rectifier triggers at the beginning of the second half cycle of AC power when the first silicon controlled rectifier has previously been fired on the first half cycle of AC power;

(d) means coupling the second inductor to the gate of the fourth silicon controlled rectifier whereby the fourth silicon controlled rectifier triggers at the beginning of the second half cycle of AC power when the third silicon controlled rectifier has previously been fired on the first half cycle of AC power;

(e) means coupling the output voltage of the magnetic amplifier to the first and third silicon controlled rectifiers so that the reversible polarity of the magnetic amplifier will trigger only one silicon controlled rectifier depending upon the polarity of the pulse from the magnetic amplifier; and (f) means coupling the AC source to the magnetic amplifier.

16. A bistable amplifier switching power from an AC source to load means depending upon the polarity and magnitude of a control current to the bistable amplifier comprising, a power control circuit connected between said AC source and said load means, silicon controlled rectifier means coupled in said circuit for controlling the flow of current between said source and said load means, said controlled rectifier means including a gate circuit, pulse generating means coupled to said circuit for triggering said controlled rectifier means depending upon the polarity and magnitude of said control current to switch power to said load means, and electrical energy storage means coupled to said gate circuit for triggering said controlled rectifier means at a predetermined time after said gate circuit is triggered by said pulse generating means.

17. The combination according to claim 16 wherein said pulse generating means includes a self-saturating push-pull magnetic amplifier having the output thereof connecting to said gate circuit, said magnetic amplifier being capable of producing a pulse output voltage for triggering said controlled rectifier means depending upon the polarity and magnitude of said control current.

18. The combination according to claim 16 wherein said energy storage means includes inductance means coupled to said control circuit so as to supply a voltage pulse to said gate circuit when the current from said source passes through zero.

19. The combination according to claim 16 wherein said energy storage means includes inductance means coupled between said gate circuit and said control circuit in series with a diode.

20. The combination according to claim 16 wherein said control circuit includes a rectifier bridge having its input terminals coupled in series with said source and said load means, said controlled rectifier means are coupled across the output terminals of said bridge, and said energy storage means are connected in one of the legs of said bridge.

21. The combination according to claim 16 wherein said control circuit includes a rectifier bridge having its input terminals connected to said source and to output terminals connected to said load means in series with said controlled rectifier means, and said energy storage means are connected in a leg of said bridge.

22. The combination according to claim 16 wherein said control circuit includes at least two controllable circuit paths coupled between said source and said load means, said controlled rectifier means include a controlled rectifier device in each of said paths, said pulse generating means are coupled to at least one of said devices for triggering said one device, and said energy storage means are coupled to at least one of said devices for retriggering said last-mentioned device.

23. The combination according to claim 22 wherein said energy storage means include a transformer having its primary winding coupled in one of said control circuit paths and its secondary winding coupled to the gate circuit of the controlled rectifier device of another of said paths.

24. The combination according to claim 22 wherein said energy storage means include an inductor connected in series with the controlled rectifier device in one of said paths and coupled through a diode to the gate circuit of the controlled rectifier device in another of said paths.

25. The combination according to claim 22 wherein said source is connected to the input terminals of a rectifier bridge, said paths and said load means are coupled in parallel series with the output terminals of said bridge, said energy storage means are connected in a leg of said rectifier bridge, and that output terminal of said bridge adjacent said storage means is coupled additionally to the gate circuits of said devices.

26. The combination according to claim 20 wherein said controlled rectifier means include a pair of controlled rectifier devices connected respectively in adjacent legs of said bridge, said load means are coupled to said output terminals, said pulse generating means are coupled to the gate circuit of one of said devices, said energy storage means are coupled to the gate circuit of the other of said devices and are connected in series with said one device in the associated leg of said bridge.

References Cited

UNITED STATES PATENTS

| | | | |
|---|---|---|---|
| 3,128,422 | 4/1964 | Brown | 321—25 X |
| 3,189,747 | 6/1965 | Hoff | 307—38 X |
| 3,202,800 | 8/1965 | Phillips et al. | |
| 3,207,949 | 9/1965 | Rice. | |
| 3,242,413 | 3/1966 | Hardies. | |
| 3,265,955 | 8/1966 | Brown. | |
| 3,316,427 | 4/1967 | Muskovac | 307—88.5 |
| 3,320,521 | 5/1967 | Yasuo Segawa et al. | 307—38 X |
| 3,335,360 | 8/1967 | Reinert. | |

ROBERT K. SCHAEFER, *Primary Examiner.*

T. J. JOIKE, *Assistant Examiner.*